(12) United States Patent
Pruszenski

(10) Patent No.: US 8,477,494 B2
(45) Date of Patent: Jul. 2, 2013

(54) TECHNIQUES WHICH INVOLVE SOLAR SHIELDING AN ELECTRONIC DEVICE

(75) Inventor: Anthony S. Pruszenski, Georgetown, MA (US)

(73) Assignee: Textron Systems Corporation, Wilmington, MA (US)

( * ) Notice: Subject to any disclaimer, the term of this patent is extended or adjusted under 35 U.S.C. 154(b) by 311 days.

(21) Appl. No.: 12/869,071

(22) Filed: Aug. 26, 2010

(65) Prior Publication Data

US 2012/0050957 A1 Mar. 1, 2012

(51) Int. Cl.
*H05K 7/20* (2006.01)

(52) U.S. Cl.
USPC ... 361/694; 361/679.49; 361/688; 361/679.5; 361/679.46; 361/704

(58) Field of Classification Search
USPC ............ 361/679.49, 688, 679.5, 694
See application file for complete search history.

(56) References Cited

U.S. PATENT DOCUMENTS

| | | | |
|---|---|---|---|
| 6,081,425 A * | 6/2000 | Cheng ........................ | 361/704 |
| 6,624,760 B1 * | 9/2003 | Kinzel et al. ............. | 340/870.11 |
| 6,932,443 B1 | 8/2005 | Kaplan et al. | |
| 2003/0050002 A1 | 3/2003 | Pfister | |
| 2006/0002084 A1 * | 1/2006 | Wei ............................. | 361/695 |
| 2009/0050365 A1 * | 2/2009 | Moore et al. ................. | 174/547 |
| 2010/0128433 A1 | 5/2010 | Harwood et al. | |

* cited by examiner

*Primary Examiner* — Tuan T Dinh
*Assistant Examiner* — Steven Sawyer
(74) *Attorney, Agent, or Firm* — BainwoodHuang

(57) ABSTRACT

An electronic assembly includes an electronic device and a solar shield coupled to the electronic device. The solar shield has an attachment portion which attaches to the electronic device, and a shield portion coupled to the attachment portion. The shield portion prevents direct sunlight from substantially reaching a section of the electronic device. The shield portion defines (i) at least a portion of an air intake, (ii) at least a portion of an air exhaust, and (iii) at least a portion of an air passageway which extends from the air intake to the air exhaust. The air passageway overlies the section of the electronic device enabling ambient air adjacent the air intake to form natural convective airflow into the air intake and out the air exhaust through the air passageway to carry away heat from the section of the electronic device during electronic operation of the electronic device.

21 Claims, 5 Drawing Sheets

TECHNIQUES WHICH INVOLVE SOLAR SHIELDING AN ELECTRONIC DEVICE

BACKGROUND

In general, an electronic device includes an enclosure and electronic circuitry which resides within the enclosure. The electronic circuitry may include a printed circuit board (PCB) and a variety of electronic components (e.g., packaged integrated circuits, discrete components, connectors, etc.) which are mounted to the PCB. During operation, the electronic circuitry typically performs electronic operations while the enclosure provides a barrier against dirt and electromagnetic interference among other things.

The particular grade of the electronic components may be largely dictated by the temperature of the operating environment of the electronic device. For example, the electronic circuitry for a device which normally operates in a relatively stable room temperature environment may include commercial grade "off the shelf" electronic components. As another example, the electronic circuitry for an industrial setting such as a manufacturing floor having a slightly elevated temperature may include industrial grade electronic components to enable the electronic circuitry to cope with the higher temperature.

In a severe outdoor environment, the electronic circuitry may even be of military grade (i.e., Mil-Spec or Mil-Std components). An example of a severe outdoor environment is a desert where sand/ground temperatures may rise to 55 degrees Celsius or more. For such a high temperature environment, the electronic device may be provisioned with electronic components which meet military grade.

SUMMARY

Unfortunately, there are drawbacks to conventional approaches to simply provisioning electronic devices with higher grade electronic components to cope with higher temperature environments. For example, since military grade electronic components are typically more expensive than industrial grade or commercial grade components, a conventional approach of simply provisioning an electronic device with military grade electronic components to enable an electronic device to withstand a high temperature environment can be a very expensive undertaking.

Furthermore, the addition of an electric heat removal mechanism such as an electric fan may not be practical particularly if the electronic device has access to a power source with limited capacity (e.g., battery power). Additionally, augmenting an electronic device with an electric fan and a larger power source to run the fan could significantly increase the cost of the electronic device. Moreover, there may be applications in which it would be disadvantageous to include a fan such as in the context of a surveillance device which is tasked with gathering audio information from the surroundings, i.e., noise from the fan operation would interfere with operation of a set of microphones collecting audio data.

In contrast to conventional approaches to simply provisioning an electronic device with higher grade components or augmenting the electronic device with an electric heat removal mechanism such as an electric fan, an improved electronic assembly includes an electronic device and a solar shield which prevents direct sunlight from substantially reaching at least a section of the electronic device. Without such a solar shield in place, the electronic device might struggle to dissipate heat generated by its own electronic circuitry as well as heat caused by direct sunlight hitting the section of the electronic device (e.g., measurements have shown that sand temperatures in some desert locations may be as high as 65 degrees Celsius due to sand heating caused by direct sunlight). However, when such a solar shield is properly in place, the electronic device does not suffer from significant additional heating due to direct sunlight. Accordingly, the electronic device is free to simply dissipate its own heat into the surroundings.

Furthermore, the solar shield preferably promotes a convective airflow over the section of the electronic device to effectively carry heat away from the electronic device without need of an electric heat removal mechanism. In particular, natural convection (i.e., convection in which fluid motion results entirely from the presence of a hot body in the fluid, causing temperature and hence density gradients to develop, so that the fluid moves under the influence of gravity) freely occurs to robustly and reliably remove heat from the electronic device. As a result, the electronic device does not overheat but instead remains within a stable operating temperature range.

One embodiment is directed to an electronic assembly which includes an electronic device and a solar shield coupled to the electronic device. The solar shield has an attachment portion which attaches to the electronic device, and a shield portion coupled to the attachment portion. The shield portion prevents direct sunlight from substantially reaching at least a section of the electronic device. The shield portion defines (i) at least a portion of an air intake, (ii) at least a portion of an air exhaust, and (iii) at least a portion of an air passageway which extends from the air intake to the air exhaust. The air passageway overlies the section of the electronic device enabling ambient air adjacent the air intake to form natural convective airflow into the air intake and out the air exhaust through the air passageway to carry away heat from the section of the electronic device during electronic operation of the electronic device.

Other embodiments are directed to electronic systems, methods and articles of manufacture which involve solar shielding. A particular embodiment is directed to a solar shield which is combinable with another device to improve the operating temperature range of the other device.

BRIEF DESCRIPTION OF THE DRAWINGS

The foregoing and other objects, features and advantages will be apparent from the following description of particular embodiments of the invention, as illustrated in the accompanying drawings in which like reference characters refer to the same parts throughout the different views. The drawings are not necessarily to scale, emphasis instead being placed upon illustrating the principles of various embodiments of the invention.

DETAILED DESCRIPTION

An improved electronic assembly includes an electronic device and a solar shield which prevents direct sunlight from substantially reaching at least a section of the electronic device. Without such a solar shield in place, the electronic device might struggle to dissipate heat generated by its own electronic circuitry as well as heat caused by direct sunlight hitting the section of the electronic device. However, when such a solar shield is properly in place, the electronic device does not suffer from significant additional heating due to direct sunlight. Rather, the electronic device is free to simply dissipate its own heat into the surroundings.

Figure 1:
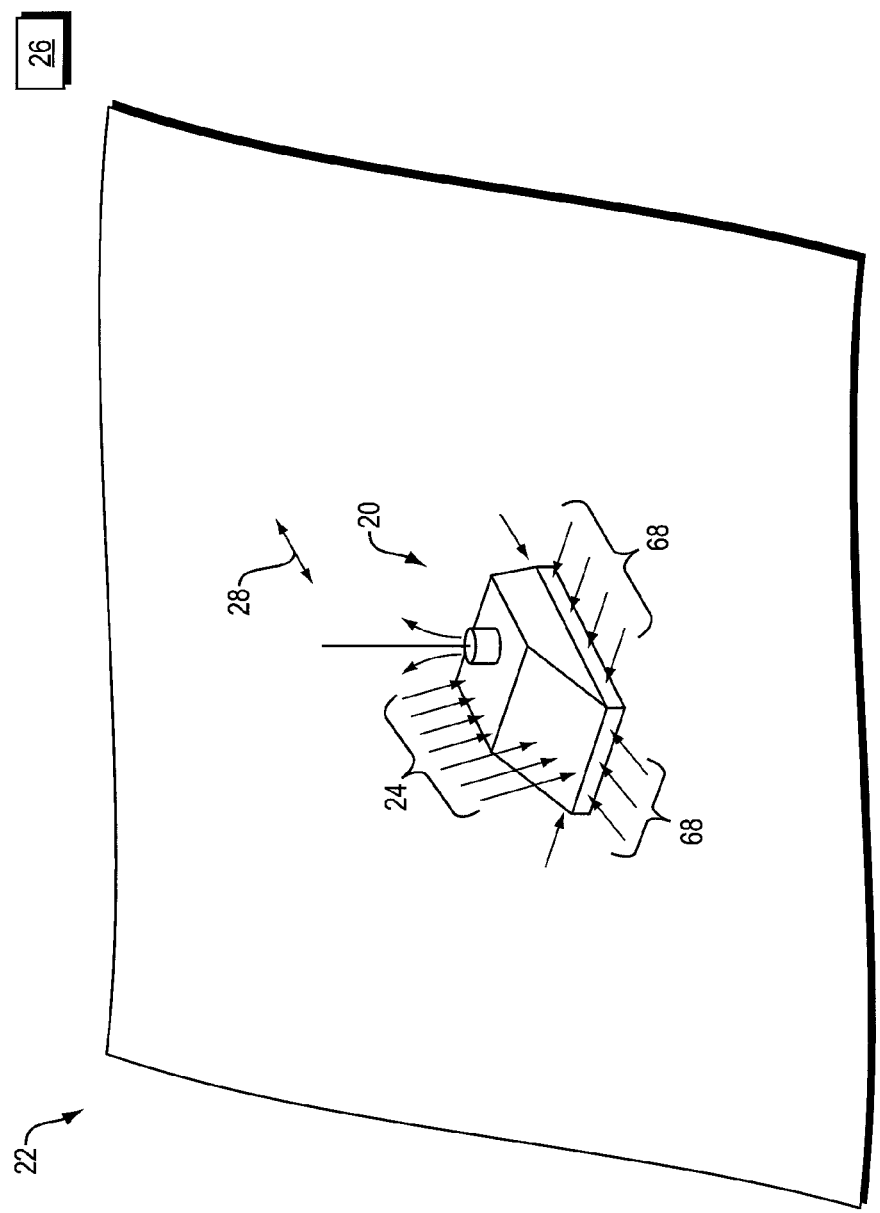
FIG. 1 is a perspective view of an electronic assembly which utilizes a solar shield to prevent direct sunlight from substantially reaching a section of an electronic device.

FIG. 1 shows an electronic assembly 20 disposed within an operating environment 22. The electronic assembly 20 utilizes a solar shield to prevent direct sunlight 24 from substantially reaching at least a section of an electronic device.

By way of example, the electronic assembly 20 will be further described herein as being constructed and arranged to operate as a surveillance mechanism within a hot desert setting. In particular, the electronic assembly 20 is capable of communicating with a remote external device 26 (e.g., a base station, another electronic assembly 20 operating as a relay along a route to the base station, etc.) in order to receive control commands and transmit gathered surveillance data (see the arrowed line 28 in FIG. 1 which represents wireless communications signals traveling in the transmit and receive directions). Further details will now be provided with reference to FIGS. 1 and 2.

Figure 2:
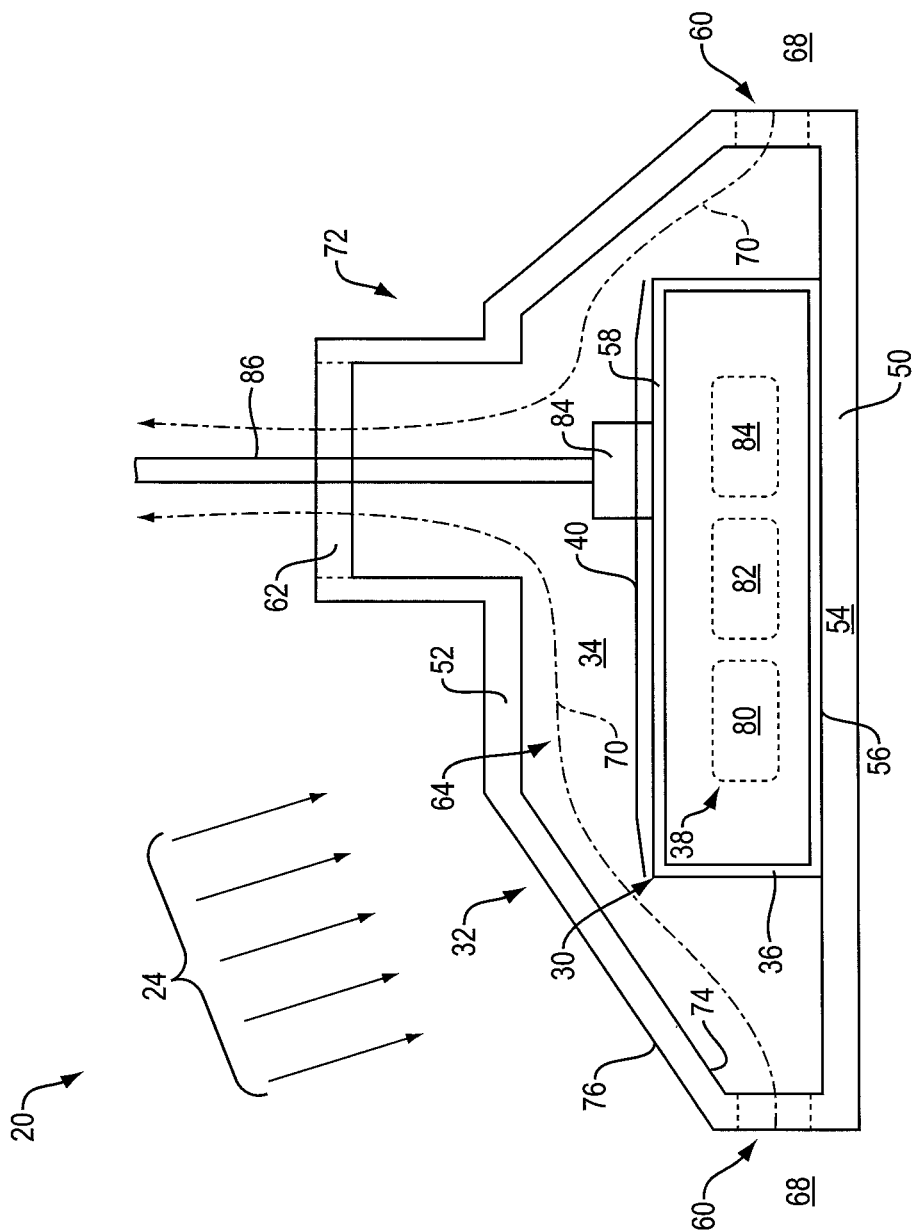
FIG. 2 is a cross-sectional side view of the electronic assembly of FIG. 1.

FIG. 2 shows a cross-sectional side view of the electronic assembly 20. As shown in the cross-sectional side view, the electronic assembly 20 includes an electronic device 30 and a solar shield 32. The solar shield 32 defines an internal space (or plenum) 34 within which the electronic device 30 resides in order to obtain protection against unnecessary heating which would otherwise be caused by exposure of the electronic device 30 to the direct sunlight 24 (also see FIG. 1). In this context, the electronic assembly 20 may have a form factor of less than 1 meter by 1 meter by 1 meter.

As shown in FIG. 2, the electronic device 30 includes a housing 36 and electronic circuitry 38. The housing 36 provides a barrier against dirt and electromagnetic interference in the traditional sense while the electronic circuitry 38 is in operation.

It should be understood that, as with any electronics, there is a tendency to generate heat during electronic operation. Preferably, the heat generated by the electronic circuitry 36 is dissipated from a top section 40 of the electronic device 30. The solar shield 32 blocks the direct sunlight 24 from hitting the top section 40 of the electronic device 30 (and perhaps all of the electronic device 30). As a result, the electronic device 30 does not struggle to dissipate its own internally generated heat as well as heat to due direct sun energy absorption. Rather, the electronic device 30 is allowed to simply dissipate its own internal generated heat.

It should be further understood that other sections of the electronic device 30 can be constructed and arranged to dissipate heat (e.g., one or more sides, combinations of the top and particular sides, etc.). Furthermore, particular sections can be configured with special materials and shapes to enhance heat dissipation (e.g., materials with high thermal transfer coefficients, baffles, fins, etc.).

As best seen in FIG. 2, the solar shield 32 includes an attachment portion 50 and a shield portion 52. The attachment portion 50 attaches to the electronic device 30 to securely maintain the electronic device 30 in a fixed position within the space 34. By way of example only, a bottom or base 54 of the solar shield 32 fastens via hardware to a support portion 56 of the housing 36 of the electronic device 30 in the version shown in FIG. 2. In this particular arrangement, the support portion 56 (e.g., the housing bottom) is opposite a heat dissipating portion 58 (e.g., the housing top) which forms the section 40 of the electronic device 30. Such an arrangement enables the internal space 34 to remain substantially free of obstructions that would otherwise hinder the ability of the electronic device 30 to dissipate internally generated heat. However, in other arrangements, at least some of the attachment portion 50 includes physical structures (e.g., tabs, hardware, etc.) which contact other locations of the housing 36 (e.g., the housing sides and/or the housing top) for improved attachment and stability.

The shield portion 52 of the solar shield 32 prevents the direct sunlight 24 from substantially reaching the section 40 of the electronic device 30. Moreover, the shield portion defines at least a portion of an air intake 60, at least a portion of an air exhaust 62, and at least a portion of an air passageway 64 which extends from the air intake 60 to the air exhaust 62 (see FIG. 2). Along these lines, the air passageway 64 overlies the section 40 of the electronic device 30 enabling ambient air 68 adjacent the air intake 60 to form a natural convection airflow 70 into the air intake 60 and out the air exhaust 62 through the air passageway 64 to carry away heat from the section 40 of the electronic device 30 during electronic operation of the electronic device 30. In more detail, the heat dissipating portion 58 of the housing 36 advantageously provides thermal coupling between the electronic circuitry 38 and the natural convection airflow 70 formed through the air passageway 64 overlying the section 40 of the electronic device 30 to robustly and reliably remove heat from the electronic circuitry 38 during operation.

It should be understood that, when the electronic device 30 is properly positioned at its location within the space 34, the air intake 60 is positioned at an intake height, and the air exhaust 62 is positioned at an exhaust height which is lower than the intake height. As a result, natural convection air current automatically form within the space 34 in directions from the air intake 60 toward the air exhaust 62 without any assistance from an electric heat removal mechanism (e.g., an electric fan).

In some arrangements (as shown in FIGS. 1 and 2), the air intake 60 takes the form of a set of intake slots which extends around a periphery of the electronic device 30. In these arrangements, the shield portion 52 of the solar shield 32 defines a dome 72 and the air exhaust takes the form of a set of exhaust openings proximate to a top of the dome 72. Additionally, in some arrangements, part of the housing 36 may combine with the shield portion 52 to form the air intake 60, the air exhaust 62 and/or the air passageway 64.

In some arrangements, the shield portion 52 includes a semi-thermally conductive material to allow an underside 74 of the shield portion 52 to elevate in temperature in response to direct sunlight hitting a topside 76 of the shield portion 52 to promote the natural convection airflow 70 through the air passageway 64. Metal or metallic foil are suitable materials for providing such thermal coupling between the topside 76 and underside 74 which is opposite the topside 76.

In other arrangements, the shield portion 52 is formed by a polymer which provides minimal solar energy absorption and maximum solar radiation deflection. Such arrangements provide maximum shielding to the electronic device 30. In yet other arrangements, the shield portion 52 is formed at least in part by as foam and/or fabric to reduce the overall weight of the electronic assembly 20.

In the example of a desert surveillance mechanism, the electronic circuitry 36 of the electronic device 30 includes sensing circuitry 80, a transceiver 82 (i.e., a transmitter and a receiver), as well as other circuitry 84 (e.g., a processor, memory, specialized encryption/decryption circuitry, etc.).

The electronic device 30 may include other components as well such as an antenna connector 84 to attach an antenna 86, or a power connector to connect to a power source, and so on. By way of example, FIG. 2 shows an arrangement in which the electronic device 30 includes an antenna connector 84 and the electronic assembly 20 further includes an antenna 86 which connects to the antenna connector 84 and protrudes from the space 34 through the air exhaust 62.

During operation, the sensing circuitry 80 gathers surveillance data in the vicinity of the electronic assembly 20, and the transmitter of the transceiver 82 transmits the gathered surveillance data to a receive of the remote external device 26 in a wireless manner (also see FIG. 1). Such surveillance data may include audio information (e.g., noise gathered by microphones of the sensing circuitry 80), video information (e.g., images gathered by cameras and infrared sensors), sensed vibrations (e.g., movement data gathered by seismographic circuitry), combinations thereof, and so on.

In some arrangements, the solar shield 32 is provided with camouflage features such as a relatively low profile and coloring to reduce the possibility of detection. For example, in the context of a desert, the solar shield 32 is preferably painted a specific color to match the desert sand (i.e., a sand surface color) and perhaps partially buried as long as the air intake 60 is not blocked in order to blend the electronic assembly 20 into the visual surroundings. Further details will now be provided with reference to FIG. 3.

Figure 3:
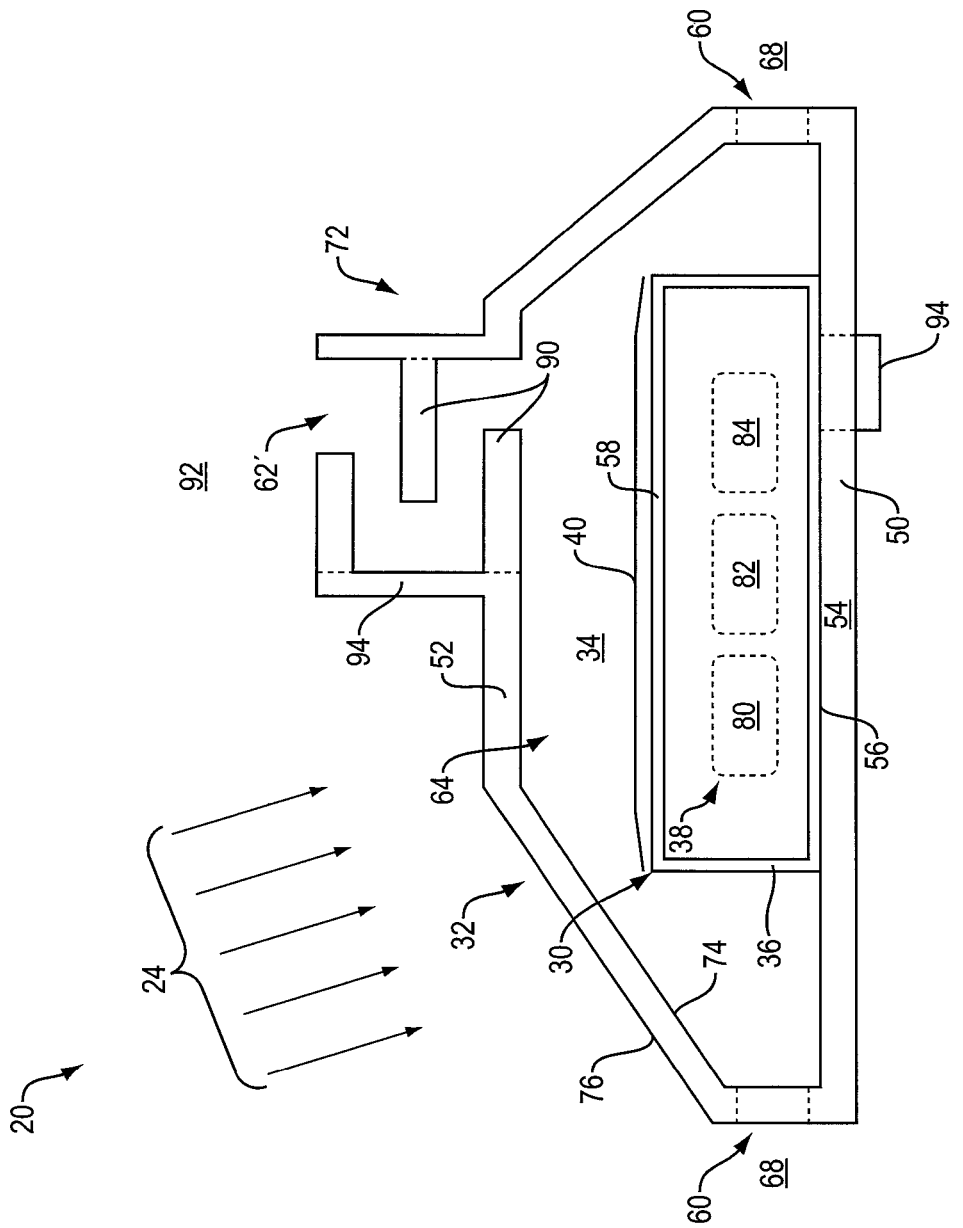
FIG. 3 is an alternative cross-sectional side view of the electronic assembly of FIG. 1.

FIG. 3 is an alternative cross-sectional side view of the electronic assembly 20 of FIG. 1. Certain earlier-described details are still present but are not shown in FIG. 3 in order to focus on particular differences to the details shown in FIG. 2. As shown in FIG. 3, the shield portion 52 of the solar shield 32 defines, as part of an air exhaust 62', multiple staggered walls (or baffles) 90 disposed in a staggered manner between an external location 92 at a top of the dome 72 and the air passageway 64.

Due to the staggered configuration of the walls 90, the shield portion 52 effectively blocks the direct sunlight 24 from penetrating through the air exhaust 62' and from being incident on the heat dissipating portion 58 of the housing 36. Nevertheless, the solar shield 32 still robustly and reliably permits the natural convection airflow 70 within the space 34 to form, flow and escape through the air exhaust 62' into the surroundings.

By way of example, the electronic assembly 20 is shown in FIG. 3 as further including a power port 94 which enables the electronic device 30 of the electronic assembly 20 to connect to an external power source such as a local battery buried in the desert sand.

It should be understood that the electronic assembly 20 in FIG. 3 includes, by way of example, three walls 90 to robustly block the direct sunlight. In other arrangements, the electronic assembly 20 includes a different number of walls 90 such as no walls 90 (but a stack structure 94), one wall 90, two walls 90, etc. The number of walls 90 can be dictated by factors such as the particular latitude, the amount of direct sunlight and/or typical weather conditions/temperatures of the environment, and so on. For example, in a high latitude location where the sun does not rise very high in the sky, an arrangement having only one wall 90, or perhaps no walls 90 and a relatively tall stack structure 94 may be sufficient. Accordingly, in some arrangements, the electronic assembly 20 includes only one wall 90, or no walls 90 and a stack 94, and so on. Further details will now be provided with reference to FIGS. 4 and 5.

Figure 4:
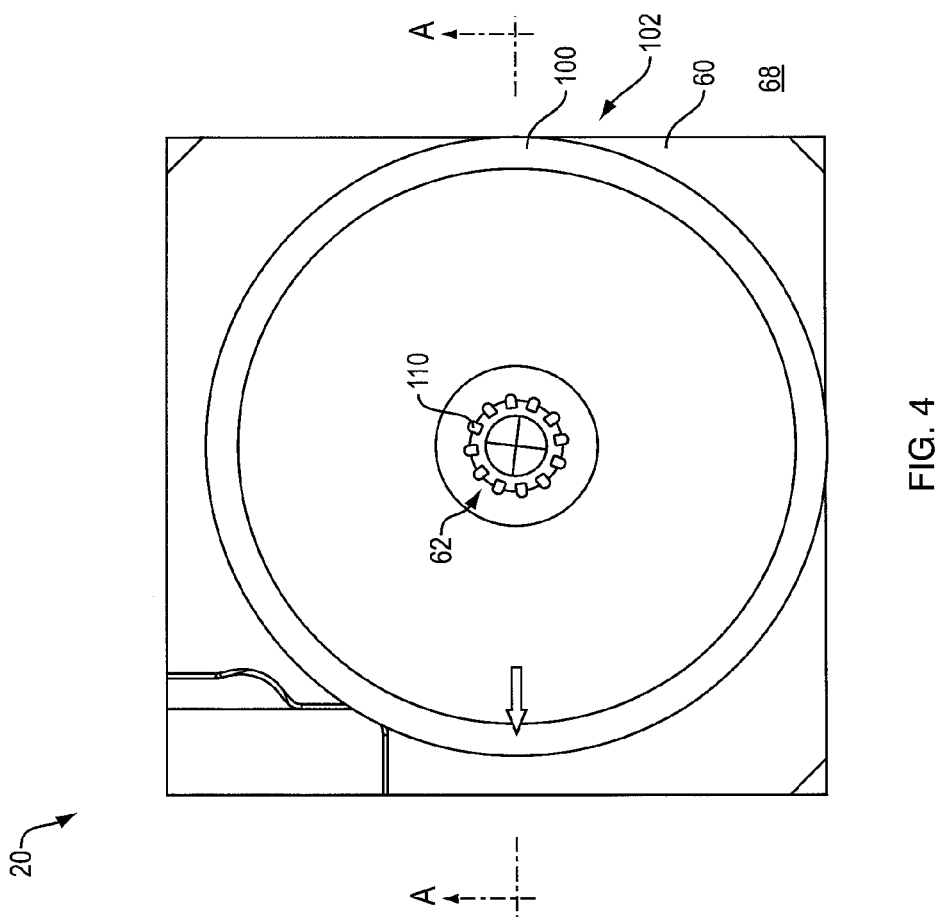
FIG. 4 is top view of another version of an electronic assembly which utilizes a solar shield to prevent direct sunlight from substantially reaching a section of an electronic device.
Figure 5:
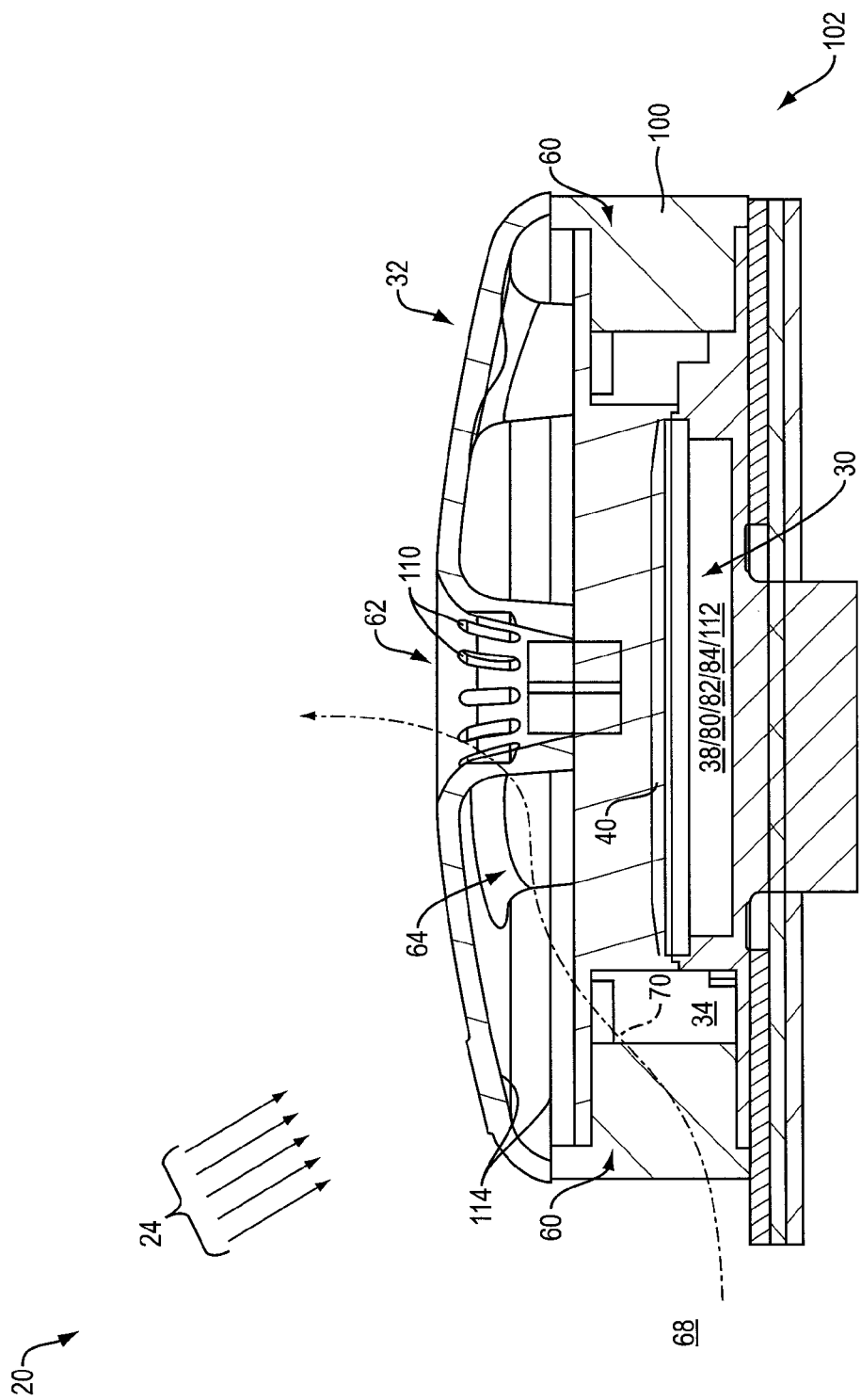
FIG. 5 is a cross-sectional side view of the electronic assembly of FIG. 4.

FIGS. 4 and 5 show the electronic assembly 20 of FIG. 1 but in an alternative version with a few variations to the details disclosed in FIGS. 2 and 3. FIG. 4 shows a top view of the alternative version. FIG. 5 shows a cross-sectional side view of the alternative version along section line A-A of FIG. 4.

In contrast to the rectangular shape of the solar shield 32 in the version of FIGS. 2 and 3, the solar shield 32 of the alternative version of FIGS. 4 and 5 has a circular shape (see the top view in FIG. 4). Furthermore, in the alternative version of FIGS. 4 and 5, the solar shield 32 includes a microphone cover 100 which extends around a periphery 102 of the electronic assembly 20 (see the cross-section view in FIG. 5). Here, the air intake 60 is essentially a single continuous intake slot which extends around the electronic device 30 and within which the microphone cover 100 resides.

In some arrangements, substantially vertical slot-shaped exhaust openings 110 of the air exhaust 62 extend around a periphery of the antenna connector 84 to provide clearance for the antenna to connect to the antenna connector 84 (the antenna is purposely omitted in FIG. 5 but shown in FIGS. 1 and 2). In these arrangements, the solar shield 32 and perhaps the antenna operate to block direct sunlight 24 from hitting the electronic device 30 which resides within the space 34 defined by the solar shield 32 (i.e., the direct sunlight 24 is prevented from being incident on portions of the electronic device 30).

In the alternative version of FIGS. 4 and 5, the microphone cover 100 allows sound and air to penetrate. Accordingly, a set of microphones 112 of the sensing circuitry 80 which is distributed around a periphery of the electronic device 30 is able to sense noise as air passes through in order to form the natural convection airflow 70.

In some arrangements, the microphone cover 100 is formed of metallic foam which enables sound and air penetration while providing rigidity for structural support. In the desert surveillance context, the microphone cover 100 is preferably painted the color of desert sand to camouflage the air intake 60.

In some arrangements, at least some of the inner surfaces of the solar shield 32 are provisioned with reflective coatings thus providing reflective surfaces 114. Such reflective surfaces 114 promote or facilitate inducement of the natural convection airflow 70 between the air intake 60 and the air exhaust 62. As a result, the healthy air movement over the electronic device 30 provides ample cooling to maintain the electronic device 30 within a stable and safe operating temperature range. In some situations, high grade electronic components may no longer be necessary thus providing the ability to lower component costs.

As described above, an improved electronic assembly 20 includes an electronic device 30 and a solar shield 32 which prevents direct sunlight 24 from substantially reaching at least a section 40 of the electronic device 30. Without such a solar shield 32 in place, the electronic device 30 might struggle to dissipate heat generated by its own electronic circuitry 38 as well as heat caused by the direct sunlight 24 hitting the section 40 of the electronic device 30. However, when such a solar shield 32 is properly in place, the electronic device 30 does not suffer from significant additional heating due to the direct sunlight 24. Rather, the electronic device 30 is free to simply dissipate its own heat into the surroundings.

While various embodiments of the invention have been particularly shown and described, it will be understood by those skilled in the art that various changes in form and details may be made therein without departing from the spirit and scope of the invention as defined by the appended claims.

For example, it should be understood that the above-described versions of the electronic assembly 20 are not mutually exclusive of each other. Rather, various aspects of the versions can be mixed and matched to provide an arrangement which is suitable for a particular use of the electronic assembly 20. For instance, the electronic assembly 20 as shown in FIGS. 2 and 3 can be easily fitted with a microphone cover 100. Likewise, the electronic assembly as shown in FIGS. 4 and 5 can be equipped with staggered walls 90 and/or a power port 94 (see FIG. 3), and so on.

Additionally, it should be understood that the solar shield 32 of the electronic assembly 20 was describe above as preventing direct sunlight 24 from a section of the electronic device 30. It is not necessary that the solar shield 32 block direct sunlight 24 from hitting the electronic device 30 in the entirety. To the contrary, in some arrangements, it may be acceptable for the direct sunlight 24 to contact a portion of the electronic device 30 as long as the solar shield 32 provides some coverage (i.e., blocks some sunlight from directly hitting the electronic device 30) thus improving the operation of the electronic device 30 by lowering the heat dissipation burden of the electronic device 30.

Moreover, it should be understood that the electronic assembly 20 was described above in the context of desert surveillance by way of example only. Nothing precludes the electronic assembly 20 from performing non-surveillance operations or from residing in a non-desert setting. Rather, the various improvements, features and enhancements are can be applied to a wide variety of electronic equipment such as stereo equipment, vehicles, outdoor electronics, and the like.

What is claimed is:

1. An electronic assembly, comprising:
    an electronic device which is constructed and arranged to perform electronic operations; and
    a solar shield coupled to the electronic device, the solar shield including:
        an attachment portion constructed and arranged to attach to the electronic device, and
        a shield portion coupled to the attachment portion, the shield portion being constructed and arranged to prevent direct sunlight from substantially reaching a section of the electronic device,
        the shield portion defining (i) at least a portion of an air intake, (ii) at least a portion of an air exhaust, and (iii) at least a portion of an air passageway which extends from the air intake to the air exhaust, the air passageway overlying the section of the electronic device enabling ambient air adjacent the air intake to form a natural convection airflow into the air intake and out the air exhaust through the air passageway to carry away heat from the section of the electronic device during electronic operation of the electronic device;
    wherein the electronic device includes (i) electronic circuitry which is constructed and arranged to perform the electronic operations and
    (ii) a housing which is constructed and arranged to house the electronic circuitry;
    wherein the housing has (i) a support portion which is constructed and arranged to support the electronic circuitry over a support location and (ii) a heat dissipating portion coupled to the support portion, the heat dissipating portion forming the section of the electronic device and providing thermal coupling between the electronic circuitry and the natural convection airflow formed through the air passageway overlying the section of the electronic device;
    wherein the shield portion of the solar shield defines a dome;
    wherein the shield portion of the solar shield defines, as the air exhaust, a set of exhaust openings proximate to a top of the dome;
    wherein the electronic device further includes an antenna connector; and
    wherein the set of exhaust openings proximate to the top of the dome extend around a periphery of the antenna connector to provide clearance for an antenna to connect to the antenna connector.

2. An electronic assembly as in claim 1 wherein, when the support portion of the housing supports the electronic circuitry over the support location, the air intake is positioned at an intake height, and the air exhaust is positioned at an exhaust height, the exhaust height being higher above the support location than the intake height.

3. An electronic assembly as in claim 2 wherein the shield portion of the solar shield defines, as the air intake, a set of intake slots which extends substantially around a periphery of the electronic device.

4. An electronic assembly as in claim 3 wherein the shield portion further defines a staggered set of walls between an external location at the top of the dome and the air passageway to permit airflow from the air passageway to the external location at the top of the dome and concurrently block the direct sunlight from being incident on the heat dissipating portion of the housing.

5. An electronic assembly as in claim 3 wherein the shield portion includes a semi-thermally conductive material to allow an underside of the shield portion to elevate in temperature in response to direct sunlight hitting a topside of the shield portion to promote the natural convection airflow through the air passageway, the underside of the shield portion facing the section of the electronic device and being opposite the topside of the shield portion.

6. An electronic assembly as in claim 3 wherein the support portion of the housing is disposed on a bottom side of the housing and the heat dissipating portion is disposed on a top side of the housing which is opposite the bottom side of the housing.

7. An electronic assembly as in claim 3 wherein the electronic device includes (i) sensing circuitry which is constructed and arranged to gather surveillance data and (ii) an electronic transmitter which is constructed and arranged to transmit the surveillance data from the sensing circuitry to an external receiver.

8. An electronic assembly as in claim 6 wherein, when the support portion of the housing supports the electronic circuitry over the support location, the intake height is substantially between a height of the bottom side of the housing and a height of the top side of the housing.

9. An electronic assembly as in claim 7 wherein the sensing circuitry includes a set of microphones which is distributed substantially around the periphery of the electronic device.

10. An electronic assembly as in claim 9, further comprising:
    a microphone cover which covers the set of microphones, the microphone cover being constructed and arranged to permit noise from surroundings of the electronic assembly to pass therethrough while concurrently camouflage the set of microphones.

11. An electronic assembly as in claim 9 wherein the microphone cover is formed of metallic foam.

12. An electronic assembly as in claim 9 wherein the microphone cover and the solar shield have a sand surface color to match desert sand.

13. A solar shield to protect an electronic device, the solar shield comprising:

an attachment portion constructed and arranged to attach to the electronic device; and a shield portion coupled to the attachment portion, the shield portion being constructed and arranged to prevent direct sunlight from substantially reaching a section of the electronic device;

the shield portion defining (i) at least a portion of an air intake, (ii) at least a portion of an air exhaust, and (iii) at least a portion of an air passageway which extends from the air intake to the air exhaust, the air passageway overlying the section of the electronic device enabling ambient air adjacent the air intake to form a natural convection airflow into the air intake and out the air exhaust through the air passageway to carry away heat from the section of the electronic device during electronic operation of the electronic device;

wherein the shield portion defines a dome;

wherein the shield portion defines, as the air exhaust, a set of exhaust openings proximate to a top of the dome;

wherein the electronic device includes an antenna connector; and wherein the set of exhaust openings proximate to the top of the dome is constructed and arranged to extend around a periphery of the antenna connector to provide clearance for an antenna to connect to the antenna connector.

14. A solar shield as in claim 13 wherein the shield portion is constructed and arranged to define, as the air intake, a set of intake slots which extends substantially around a periphery of the electronic device.

15. A solar shield as in claim 14 wherein the shield portion further defines a staggered set of walls between an external location at the top of the dome and the air passageway to permit airflow from the air passageway to the external location at the top of the dome and concurrently block the direct sunlight from being incident on the section of the electronic device.

16. A solar shield as in claim 15 wherein the shield portion includes a semi-thermally conductive material to allow an underside of the shield portion to elevate in temperature in response to direct sunlight hitting a topside of the shield portion to promote the natural convection airflow through the air passageway, the underside of the shield portion facing the section of the electronic device and being opposite the topside of the shield portion.

17. An electronic assembly, comprising:

an electronic device which is constructed and arranged to perform electronic operations; and a solar shield coupled to the electronic device, the solar shield including:

an attachment portion constructed and arranged to attach to the electronic device, and a shield portion coupled to the attachment portion, the shield portion being constructed and arranged to prevent direct sunlight from substantially reaching a section of the electronic device, the shield portion defining (i) at least a portion of an air intake, (ii) at least a portion of an air exhaust, and (iii) at least a portion of an air passageway which extends from the air intake to the air exhaust, the air passageway overlying the section of the electronic device enabling ambient air adjacent the air intake to form a natural convection airflow into the air intake and out the air exhaust through the air passageway to carry away heat from the section of the electronic device during electronic operation of the electronic device;

wherein the electronic device includes (i) electronic circuitry which is constructed and arranged to perform the electronic operations and (ii) a housing which is constructed and arranged to house the electronic circuitry;

wherein the housing has (i) a support portion which is constructed and arranged to support the electronic circuitry over a support location and (ii) a heat dissipating portion coupled to the support portion, the heat dissipating portion forming the section of the electronic device and providing thermal coupling between the electronic circuitry and the natural convection airflow formed through the air passageway overlying the section of the electronic device;

wherein the electronic device includes (i) sensing circuitry which is constructed and arranged to gather surveillance data and (ii) an electronic transmitter which is constructed and arranged to transmit the surveillance data from the sensing circuitry to an external receiver; and wherein the sensing circuitry includes a set of microphones which is distributed substantially around a periphery of the electronic device.

18. An electronic assembly as in claim 17, further comprising:

a microphone cover which covers the set of microphones, the microphone cover being constructed and arranged to permit noise from surroundings of the electronic assembly to pass therethrough while concurrently camouflage the set of microphones.

19. An electronic assembly as in claim 17 wherein the microphone cover is formed of metallic foam.

20. An electronic assembly as in claim 17 wherein the microphone cover and the solar shield have a sand surface color to match desert sand.

21. An electronic assembly as in claim 17 wherein, when the support portion of the housing supports the electronic circuitry over the support location, the air intake is positioned at an intake height, and the air exhaust is positioned at an exhaust height, the exhaust height being higher above the support location than the intake height; and wherein the shield portion of the solar shield defines, as the air intake, a set of intake slots which extends substantially around the periphery of the electronic device.

* * * * *